United States Patent [19]

Kojima

[11] Patent Number: 5,053,842
[45] Date of Patent: Oct. 1, 1991

[54] SEMICONDUCTOR NONVOLATILE MEMORY

[75] Inventor: Yoshikazu Kojima, Tokyo, Japan

[73] Assignee: Seiko Instruments Inc., Japan

[21] Appl. No.: 530,269

[22] Filed: May 30, 1990

[51] Int. Cl.⁵ .......................................... H01L 27/01
[52] U.S. Cl. .................... 357/23.5; 357/55; 357/54; 365/185
[58] Field of Search ............... 357/23.5, 55, 54, 23.5; 365/185

[56] References Cited

U.S. PATENT DOCUMENTS

| 4,542,396 | 9/1985 | Schutter et al. | |
|---|---|---|---|
| 4,774,556 | 9/1988 | Fujii et al. | |
| 4,796,228 | 1/1989 | Baglee | |
| 4,929,988 | 5/1990 | Yoshikawa | 357/23.5 |

FOREIGN PATENT DOCUMENTS

| 58-206165 | 12/1983 | Japan | 357/23.5 |
|---|---|---|---|
| 59-61188 | 4/1984 | Japan | 357/23.5 |
| 60-50964 | 3/1985 | Japan | 357/23.5 |
| 62-71277 | 4/1987 | Japan | 357/23.5 |
| 62-85468 | 4/1987 | Japan | 357/23.5 |
| 62-86866 | 4/1987 | Japan | 357/23.5 |

Primary Examiner—Jerome Jackson, Jr.
Assistant Examiner—Dang Xuan Hung
Attorney, Agent, or Firm—Bruce L. Adams; Van C. Wilks

[57] ABSTRACT

The invention is directed to a semiconductor nonvolatile memory of the floating gate type having dual gate structure comprised of a first channel region having a channel resistance controlled by a control gate electrode and a second channel region having a channel resistance controlled by a floating gate electrode. The first channel region is formed on one face section of semiconductor substrate which has a crystal face orientation different from that of another face section on which the second channel region is formed. By such construction, channel length of the first and second channel regions can be shortened to increase memory capacity density and to improve quality.

16 Claims, 2 Drawing Sheets

SEMICONDUCTOR NONVOLATILE MEMORY

BACKGROUND OF THE INVENTION

The present invention relates to a semiconductor nonvolatile memory utilized in electronic devices such as computers.

As shown in FIG. 2 a conventional semiconductor nonvolatile memory of the floating gate type is constructed such that a source region 2' and a drain region 3' of N+ type are formed in a face of a semiconductor substrate 1' of P type, a control gate electrode 8' is formed on a first channel region 4' through an insulating film 6', and a floating gate electrode 9' is formed on a second channel region 5' through another insulating film 7'. Such type of the known nonvolatile memory is disclosed, for example, in Daniel C. Guterm et al. "Electrically Alterable Nonvolatile Memory cell using a Floating-Gate Structure" IEEE Trans. Electron Device, vol. ED-26, No. 4, pp576-585(1979).

However, in the conventional semiconductor nonvolatile memory, the first channel region 4' and the second channel region 5' are formed by transfer printing technology so that the respective channel lengths $L_1$ and $L_2$ cannot be reduced smaller than the transfer printing resolution of the respective gate electrodes, thereby causing the drawback that it would be difficult to lower a programing voltage effective to inject electric charges into the floating gate electrode.

SUMMARY OF THE INVENTION

Accordingly, in order to remove such a drawback of the prior art, an object of the present invention is to provide an improved structure effective to form respective channel lengths $L_1$ and $L_2$ of the first and second channel regions in the order of submicrons so as to lower the programing voltage less than a power source voltage.

In order to solve the above noted problem, according to the present invention, the first channel region is formed on a crystal face section having an orientation different from that of another crystal face section on which the second channel region is formed over a semiconductor crystal surface. By such a construction, one of the channel lengths can be formed in registration with the dimension of the corresponding face section and the other of the channel lengths can be dimensioned according to the thickness of the gate electrodes in the order of submicrons to thereby realize a low-voltage-programed semiconductor nonvolatile memory.

BRIEF DESCRIPTION OF THE INVENTION

DETAILED DESCRIPTION OF EMBODIMENT

Figure 1:
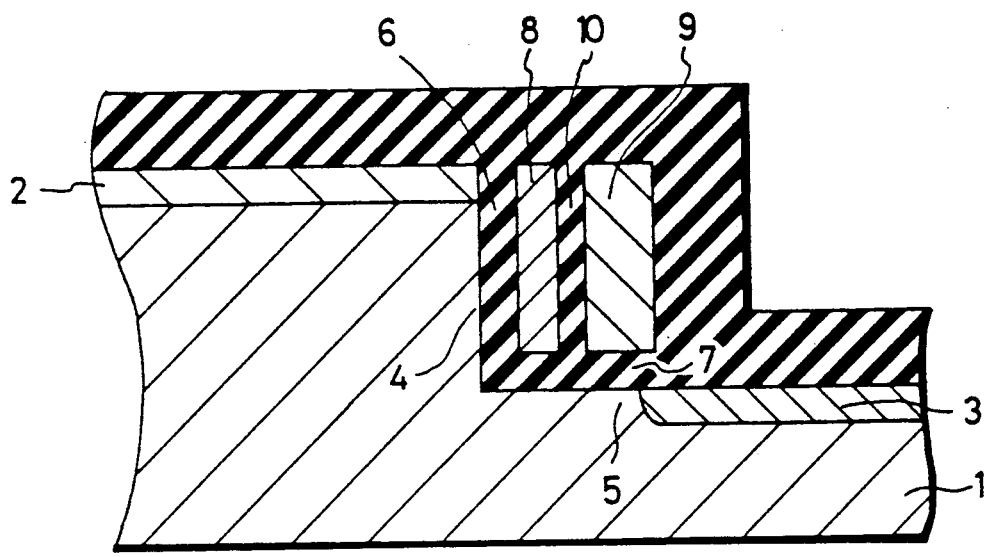
FIG. 1 is a sectional view showing a first embodiment of the inventive semiconductor nonvolatile memory.
Figure 2:
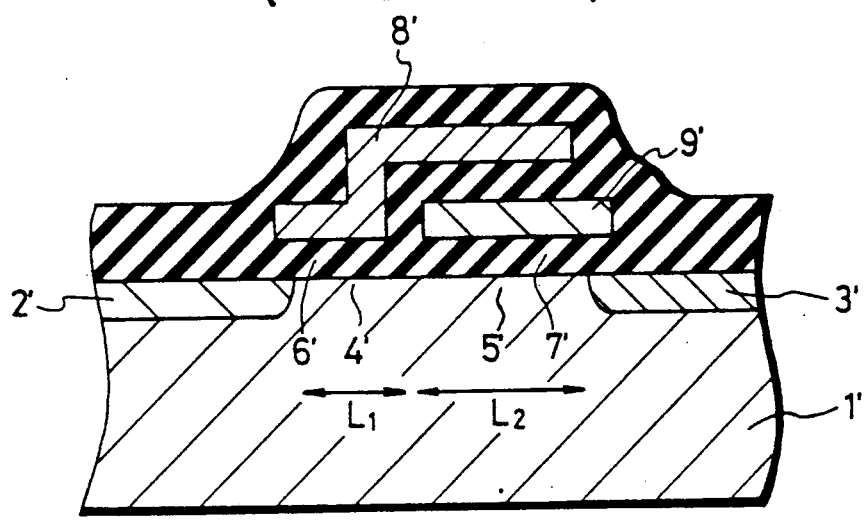
FIG. 2 is a sectional view showing a conventional semiconductor nonvolatile memory.

Hereinafter, embodiments of the invention will be described in conjunction with the drawings. FIG. 1 is a sectional view showing a first embodiment of the inventive semiconductor nonvolatile memory. A pair of N+ type source region 2 and drain region 3 are formed on a P type semiconductor substrate 1. A first channel region 4 and a second channel region 5 are disposed on a face of the substrate 1 between the source region 2 and the drain region 3. Conductance of the first channel region 4 can be controlled by a voltage applied to a control gate electrode 8 formed through a first gate oxide film 6. Conductance of the second channel region 5 is changed by an electric potential of a floating gate electrode 9 formed through a second gate oxide film 7. Accordingly, since the electric potential varies according to an amount of electric charges injected into the floating gate electrode 9, the electric charge amount can be detected in terms of conductance change between the source region 2 and the drain region 3 to thereby read out the information stored in the memory. The memorized information is represented by the electric charge amount stored in the floating gate electrode 9; hence the information does not disappear during normal operation. Moreover, the information is nonvolatile because it never disappears even when the power source is turned off.

As shown in FIG. 1, the first channel region 4 is formed in a side face section of a stepped portion provided on the substrate 1. The control gate electrode 8 and the floating gate electrode 9 are formed sequentially on the side face of the stepped portion in superposed vertical structure through the respective insulating films 6 and 10. For example, a polysilicon film is formed over the substrate surface which is formed with a stepped portion, and then anisotropic etching such as sputtering is effected such that the polysilicon film is left only on the side face section. In similar manner, the gate electrodes are formed by anisotropic etching such that the vertical length of the gate electrodes is made identical to the height of the stepped portion. In such a fabrication process, the second channel region 5 is formed in registration with the thickness of the floating gate electrode 9.

In injection electric changes into the floating gate electrode 9, the drain region 3 is applied with a voltage of about 7 V and the control gate electrode 8 is applied with a high voltage of about 10 V. The floating gate electrode 9 is held at a high potential level in response to that of the control gate electrode 8 strongly capacitively coupled thereto through the control gate insulating film 10, hence channel current flows between the source region 2 and the drain region 3 to generate in the vicinity of the drain region 3, due to a drain voltage, hot electrons so that a part of the hot electrons can be injected into the floating gate electrode 9 to thereby effect channel injection. Efficiency of the channel injection and drain voltage required for the channel injection are significantly dependent on the length of the first and second channel regions.

In the semiconductor nonvolatile memory shown in FIG. 1, the length of the first channel region 4 is determined by the height of the sidewall of the stepped portion of the substrate 1 and the thickness of the control gate electrode 8, and the length of the second channel region 5 is determined by the thickness of the floating gate electrode 9, both with accuracy in the order of about 100 Å. Importantly in the inventive structure, the stepped portion can be formed by etching of the substrate or by epitaxial growth of crystal. The stepped portion has the vertical sidewall in the FIG. 1 embodiment; however, the angle of the side face is not limited to 90°, but may be suitably set to differentiate the crystal face orientation of the side face from that of the substrate major face.

Figure 3:
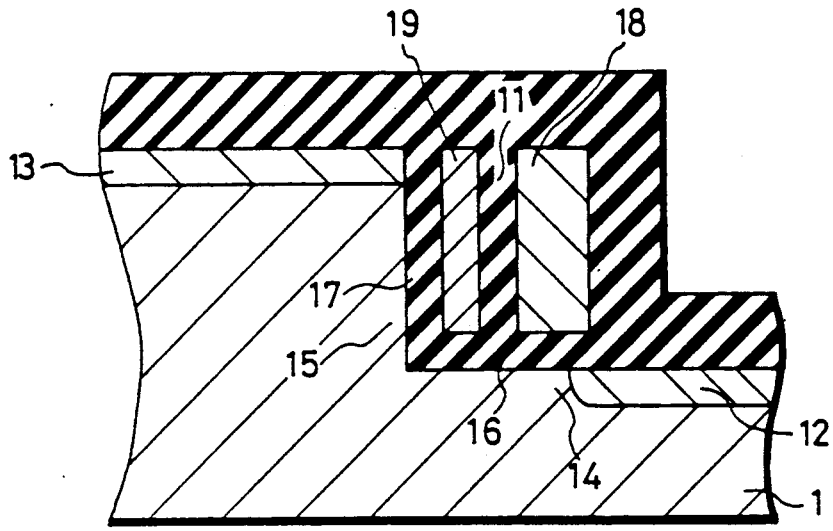
FIG. 3, 4 and 5 show a sectional view of second, third and fourth embodiments, respectively, of the inventive semiconductor nonvolatile memory.

FIG. 3 is a sectional view showing a second embodiment of the inventive semiconductor nonvolatile memory. In the second embodiment, the first channel region 14 is formed such that its channel length is determined by the thickness of the control gate electrode 18. Further, the second channel region 15 is formed in a side face of the stepped portion of the substrate 1, and its conductance is controlled by a potential level of the floating gate electrode 19 which is formed through the second gate oxide film 17, and further its channel length corresponds to the height of the stepped portion. N+ type of the source region 12 partly overlaps with the thickness of the control gate electrode 18, and N+ type of the drain region 13 overlaps with the floating gate electrode 19 through the insulating film 17. Reading of stored information and programming can be carried out in a manner similar to the first embodiment.

In the second embodiment as well, the length of the respective channel regions is determined by the height of the stepped portion or the thickness of gate electrodes in accurate dimension, thereby forming a channel region of the length in the order of submicrons. The inventive semiconductor nonvolatile memory can erase its stored information by irradiation of ultraviolet rays as well as by an electrical method.

Figure 4:
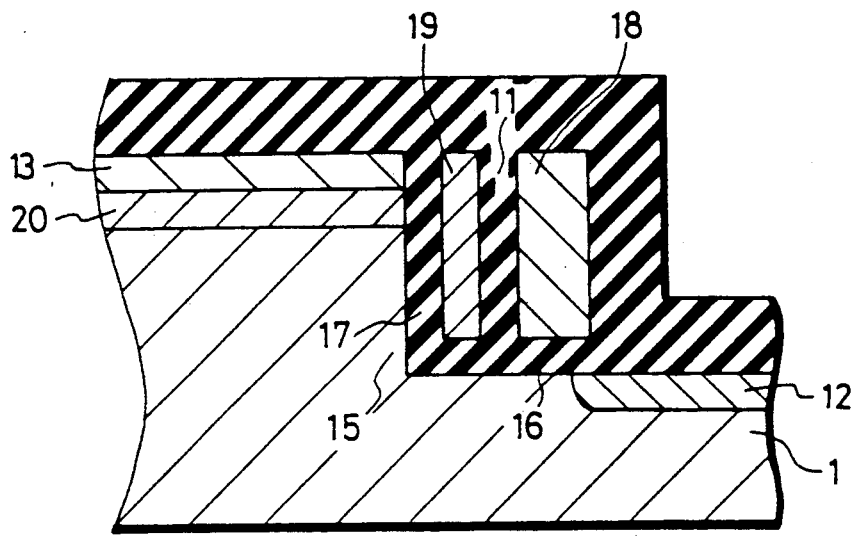

FIG. 4 is a sectional view showing a third embodiment of the inventive semiconductor nonvolatile memory. This embodiment has a structure generally similar to that of the second embodiment, and includes in addition an N− type drain region 20. The drain region 13 is applied with about 15 V and the control gate electrode 18 is applied with 0 V so that a high electric potential is applied to the second gate oxide film 17 so as to draw or extract electrons from the floating gate electrode 19 into the drain region 13 to effect erase of information. The inventive memory is constructed such that the first and second channel regions are connected in series to each other. Therefore, even when electrons are considerably extracted from the floating gate electrode 19 so that it is held at a positive potential, no electric current flows through the channel regions as long as no voltage is applied to the control gate electrode 18.

Application of a high voltage to the drain region 13 might cause surface breakdown on the second channel region 15. The additional N− type drain region 20 is formed to avoid such breakdown. In the FIG. 4 semiconductor nonvolatile memory, the N− type drain region 20 can be formed prior to the formation of the second gate oxide film 17. Therefore, the gate oxide film 17 can be formed without high temperature processing. Consequently, trap efficiency of hot electrons is relatively small with respect to the second gate oxide film 17, thereby increasing the number of rewriting cycles. The conventional structure needs high temperature processing in order to form the N− type drain region 20; hence a semiconductor nonvolatile memory of the high temperature writing type cannot be fabricated.

Figure 5:
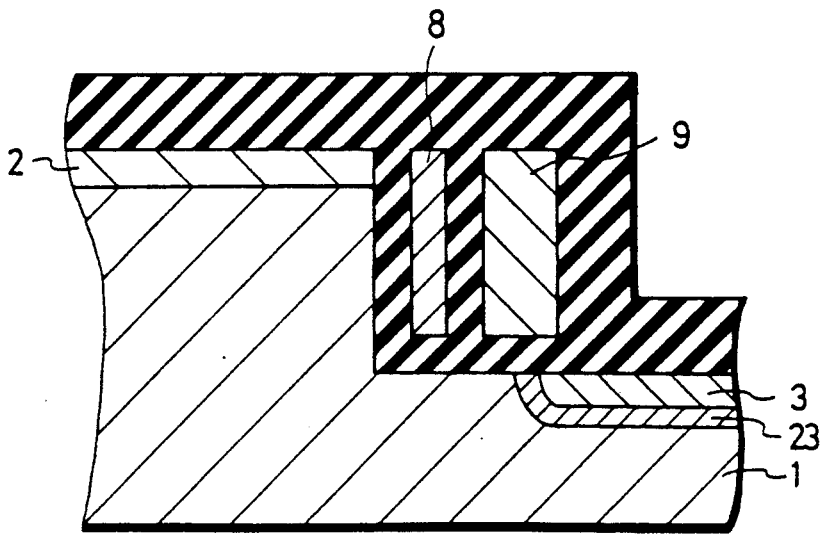

FIG. 5 shows a fourth embodiment of the inventive semiconductor nonvolatile memory, constructed such that an N− type drain region 23 is added in the structure of the FIG. 1 embodiment. By applying high voltage of about 15 V to the drain region 3, electrons stored in the floating gate electrode 9 can be drawn into the drain region 3.

As described above, according to the present invention, in the semiconductor nonvolatile memory of dual gate structure, the respective channel lengths can be formed in registration to the height of a stepped portion formed on the substrate surface and to the thickness of gate electrodes in accurate dimensions of submicron order, thereby achieving advantages such as improvement of programming characteristics, high quality and high density.

What is claimed is:

1. A semiconductor nonvolatile memory comprising:
   a semiconductor substrate of a first conductivity type having a stepped portion having a top face section and a bottom face section separated from one another by a side face section;
   a source region of a second conductivity type provided in the top face section of the stepped portion;
   a drain region of the second conductivity type provided in the bottom face section of the stepped portion;
   a first channel region adjacent to the source region and formed in the side face section and in a part of the bottom face section of the stepped portion;
   a second channel region formed between the first channel region and the drain region in the bottom face section of the stepped portion;
   a control gate electrode formed over the first channel region and the source region through a gate insulating film for controlling the first channel region conductance; and
   a floating gate electrode formed over the second channel region through a gate insulating film for controlling the second channel region conductance.

2. A semiconductor nonvolatile memory according to claim 1; wherein the top and bottom face sections are parallel to one another.

3. A semiconductor nonvolatile memory according to claim 1; wherein the side face section extends at given angles relative to the top and bottom face sections.

4. A semiconductor nonvolatile memory according to claim 3; wherein the given angle between the top and side face sections is approximately 90°.

5. A semiconductor nonvolatile memory according to claim 3; wherein the given angle between the bottom and side face sections is approximately 90°.

6. A semiconductor nonvolatile memory according to claim 1; wherein the control gate electrode and floating gate electrode are disposed in side-by-side relation and are separated from one another by a gate insulating film.

7. A semiconductor nonvolatile memory according to claim 1; wherein the first and second channel regions each have a length having an accuracy on the order of about 100 Å.

8. A semiconductor nonvolatile memory according to claim 1; wherein the source and drain regions are of the N+ type; and further including an additional drain region of the N− type interposed between the N+ type drain region and the bottom face section of the stepped portion.

9. A semiconductor nonvolatile memory comprising:
   a semiconductor substrate of a first conductivity type having a stepped portion having a top face section and a bottom face section separated from one another by a side face section;
   a source region of a second conductivity type provided in the bottom face section of the stepped portion;
   a drain region of the second conductivity type provided in the top face section of the stepped portion;

a first channel region adjacent to the source region and formed in the bottom face section of the stepped portion;

a second channel region formed between the drain region and the first channel region in the side face section and in a part of the bottom face section of the stepped portion;

a control gate electrode formed over the first channel region and the source region through a gate insulating film for controlling the first channel region conductance; and a floating gate electrode formed over the second channel region through a gate insulating film for controlling the second channel region conductance.

10. A semiconductor nonvolatile memory according to claim 9; wherein the top and bottom face sections are parallel to one another.

11. A semiconductor nonvolatile memory according to claim 9; wherein the side face section extends at give angles relative to the top and bottom face sections.

12. A semiconductor nonvolatile memory according to claim 11; wherein the given angle between the top and side face sections is approximately 90°.

13. A semiconductor nonvolatile memory according to claim 11; wherein the given angle between the bottom and side face sections is approximately 90°.

14. A semiconductor nonvolatile memory according to claim 9; wherein the control gate electrode and floating gate electrode are disposed in side-by-side relation and are separated from one another by a gate insulating film.

15. A semiconductor nonvolatile memory according to claim 9; wherein the first and second channel regions each have a length having an accuracy on the order of about 100 Å.

16. A semiconductor nonvolatile memory according to claim 9; wherein the source and drain regions are of the N+ type; and further including an additional drain region of the N− type interposed between the N+ type drain region and the top face section of the stepped portion.

* * * * *